(12) United States Patent
Savary et al.

(10) Patent No.: US 10,700,672 B2
(45) Date of Patent: Jun. 30, 2020

(54) DUTY CYCLE MONITOR CIRCUIT AND METHOD FOR DUTY CYCLE MONITORING

(71) Applicant: NXP USA, Inc., Austin, TX (US)

(72) Inventors: Pierre Savary, Muret (FR); Cristian Pavao Moreira, Frouzins (FR); Matthis Bouchayer, Toulouse (FR); Jean-Stephane Vigier, Mondonville (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/591,758

(22) Filed: Oct. 3, 2019

(65) Prior Publication Data

US 2020/0136599 A1    Apr. 30, 2020

(30) Foreign Application Priority Data

Oct. 29, 2018 (EP) .................................. 18306408

(51) Int. Cl.
| | |
|---|---|
| *H03K 3/017* | (2006.01) |
| *H03K 5/04* | (2006.01) |
| *H03K 5/156* | (2006.01) |
| *H03K 7/08* | (2006.01) |
| *H04B 1/40* | (2015.01) |

(52) U.S. Cl.
CPC ............. *H03K 5/1565* (2013.01); *H04B 1/40* (2013.01)

(58) Field of Classification Search
CPC ................................ H03K 5/1565; H04B 1/40
See application file for complete search history.

(56) References Cited

U.S. PATENT DOCUMENTS

| | | | |
|---|---|---|---|
| 4,642,748 A | 2/1987 | Kirk | |
| 7,733,143 B2 * | 6/2010 | Guo | ..................... H03K 5/1565 327/172 |
| 7,961,599 B2 | 6/2011 | Proulx | |

(Continued)

FOREIGN PATENT DOCUMENTS

WO    1995022206    8/1995

*Primary Examiner* — Kenneth B Wells

(57) ABSTRACT

An electronic system includes a clock generation circuit to generate a clock signal; and a duty cycle monitoring circuit, DTC, to monitor a duty cycle of the generated clock signal. The DTC includes a differential signal generator circuit to generate an inverted and a non-inverted representation of the generated clock signal. An averaging circuit averages the non-inverted representation and the inverted representation of the generated clock signal. A comparison circuit includes at least a first comparator to compare the averaged non-inverted representation of the generated clock signal with a second respective reference voltage threshold and a second comparator configured to compare the averaged inverted representation with a first respective reference voltage threshold. A reference voltage generation circuit provides the first respective reference voltage threshold associated with the averaged inverted representation of the generated clock signal and provides the second respective reference voltage threshold associated with the non-inverted representation of the generated clock signal. A summing circuit is sums outputs of the first and second comparators and outputs a monitored duty cycle of the generated clock signal.

20 Claims, 5 Drawing Sheets

(56) References Cited

U.S. PATENT DOCUMENTS

| | | | |
|---|---|---|---|
| 8,736,329 B1 * | 5/2014 | Rajavi | H03K 5/1565 |
| | | | 327/172 |
| 8,773,186 B1 | 7/2014 | Liou et al. | |
| 9,030,244 B1 | 5/2015 | Luo et al. | |
| 10,205,455 B2 * | 2/2019 | Aremallapur | H03K 3/0307 |
| 2005/0007168 A1 | 1/2005 | Park et al. | |
| 2005/0058233 A1 | 3/2005 | Nguyen et al. | |
| 2007/0075753 A1 | 4/2007 | Parker et al. | |
| 2017/0337952 A1 | 11/2017 | Shi et al. | |

\* cited by examiner

DUTY CYCLE MONITOR CIRCUIT AND METHOD FOR DUTY CYCLE MONITORING

FIELD OF THE INVENTION

The field of the invention relates to a duty cycle monitor circuit, an electronic system with a clock signal, for example a communication unit, such as a radar unit, and a method for duty cycle monitoring. The invention is applicable to, but not limited to, duty cycle monitoring in any system that uses a clock, e.g. a radar unit that includes a distributed master-slave arrangement.

BACKGROUND OF THE INVENTION

There has been an increased demand for active safety systems for vehicles. Active safety systems require multiple radar sensors per vehicle, each radar sensor typically working with a specific radar technology. In an automotive application, the radar sensors are mostly built using a number of integrated circuits (ICs), sometimes referred to as 'chips'. The current trend is towards offering a radar system on chip (SoC), using a radio frequency (RF) complementary metal-oxide-semiconductor (CMOS) process technology) solution in order to reduce cost and power consumption. Commercial automotive radar sensors typically include multiple receivers and transmitters (the combination of which is referred to as transceivers (TRx)). A microcontroller (MCU) performs digital control of the transceiver circuits and digital signal processing of the digitized data (e.g. fast fourier transform (FFT) and digital signal processing) in order to output processed radar data to the MCU of the vehicle.

Next generation high performance radar solutions, used for highly automated or fully autonomous driving, will need to comply with stringent radar angular resolution requirements in both azimuth and elevation. Angular resolution is directly related to the radar system number of receiver antennas and their location with respect to each other. Current monolithic radar transceiver ICs are typically constrained to contain only a few transceiver channels, as the complexity and cost and heat dissipation problems of integrating more transceiver channels on the same chip increases substantially with the number of ICs that are included. To allow increased angular resolution in both azimuth and elevation, a multi-chip set solution with a master device and one or several slave devices may be used. With multi-chip set solutions, a master-slave (MS) clock signal is generated by the master device and used as a time base for synchronization of the microcontroller time based events with any other master device and all slave devices.

Duty cycle (DTC) monitoring circuits are well known in the literature, where they are typically coupled to a duty cycle corrector in order to track and correct a duty cycle of a given signal, generally a clock signal. In automotive radar applications that target safety-critical standards, such as ISO 26262, the use of duty cycle monitors is effectively mandatory, in order to guarantee signal integrity and provide a safety mechanism that is able to track any malfunctioning of a given circuit, such as a clock signal generator, or any circuit that uses clock signals. However, in modern Radar vehicle applications, for example applications that target highly-automated driving and further fully autonomous driving, the use of a DTC monitoring circuit coupled to a DTC corrector circuit is typically incompatible with the application. Effectively, a use of a 'DTC corrector' corrects the duty cycle failure, and by doing this, it hides the cause of the circuit or component failure, which is not ideal. Such a circuit or component failure, despite any duty cycle issue being corrected, may degrade a Radar system's performance (e.g. analog-to-digital conversion (ADC) performance, a signal-to-noise ratio (SNR) performance, a phase locked loop (PLL) performance, etc. This may lead to a misinterpretation of the data processed by the Radar System. Indeed, for safety related applications, safety mechanisms such as very accurate and process-voltage-temperature (PVT)-insensitive DTC monitors are of high importance, and are used throughout a radar IC device, for both standalone transceiver, or multi-transceiver (cascading) radar applications.

In most DTC monitoring circuit implementations, a single-ended clock detector (or monitoring) circuit is used, thereby limiting the achievable DTC monitoring accuracy. DTC monitoring circuits that do not use single-ended clock detector circuits are typically very complex and use costly algorithms in order to increase DTC detection accuracy through a calibration process. Furthermore, known DTC monitoring circuits that use calibration circuits often require additional circuitry and storage, such as a look up table. This additional circuitry increases die area. Also, known DTC monitoring circuits often run in real-time, thereby increasing power consumption, in order to guarantee the DTC under temperature variations or fluctuations.

U.S. Pat. No. 8,773,186 B1 describes a DTC corrector circuit that includes a known DTC detector that is incapable of detecting fine differences in a generated signal duty cycle. In U.S. Pat. No. 8,773,186 B1, the duty cycle detector only provides information if the duty cycle is above or below 50%, and the feedback loop permanently adjusts the duty cycle (with the duty cycle corrector) around this 50% threshold. This approach results in a duty cycle that is 50% on average, but is permanently moving (e.g. maintained between 49%-51%). This type of behaviour is not good for most applications, as it can create a modulation on the clock signal duty cycle, which can create noise or spurious emissions (e.g. jitter) on the clock (ADC_clk in FIG. 1 of U.S. Pat. No. 8,773,186 B1 for example). Indeed, in this implementation, extensive calibration techniques must be used to improve the accuracy, thereby resulting in increased test time and additional circuitry for the calibration (additional die area).

Thus, a mechanism is needed to provide an improved duty cycle monitor circuit, for example one that operates within a broad, defined window of operation.

SUMMARY OF THE INVENTION

The present invention provides a duty cycle monitoring circuit, an electronic system that uses a clock, such as a communication unit, for example a radar unit, and method for duty cycle monitoring, as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Examples of the invention describe an electronic system, which in the illustrated examples are in a form of a communication unit, such as a radar unit, which includes a clock generation circuit configured to generate a clock signal; and a duty cycle monitoring circuit, DTC, configured to monitor a duty cycle of the generated clock signal. The DTC includes a differential signal generator circuit configured to generate an inverted representation and a non-inverted representation of the generated clock signal. An averaging circuit is configured to average the non-inverted representation and average the inverted representation of the generated clock signal. A comparison circuit includes at least a first comparator configured to receive and compare the averaged non-inverted representation of the generated clock signal with a second respective reference voltage threshold and a second comparator configured to receive and compare the averaged inverted representation with a first respective reference voltage threshold. A reference voltage generation circuit is configured to provide the first respective reference voltage threshold associated with the averaged inverted representation of the generated clock signal and provide the second respective reference voltage threshold associated with the non-inverted representation of the generated clock signal. A summing circuit is configured to sum outputs of the first comparator and second comparator, wherein an output of the summing circuit comprises a monitored duty cycle of the generated clock signal, which is substantially impervious to any process, voltage or temperature variations.

Although examples of the invention are described with respect to a radar application, it is envisaged that the duty cycle monitoring circuit herein described is equally applicable to any clock-related system or device and/or any circuit where a signal duty cycle needs to be tracked. Furthermore, the averaging circuit can be implemented with any known mechanism to average a signal, such as a clock signal, and the illustrated R-C filter is one such example.

Although examples of the invention describe a logic 'AND' gate as the summing component or circuit that is used to combine the respective outputs of the comparators, it is envisaged that other examples may use any signal combining mechanism or circuit that is capable of outputting a pulse that is indicative of the duty cycle monitor as described herein.

Figure 1:
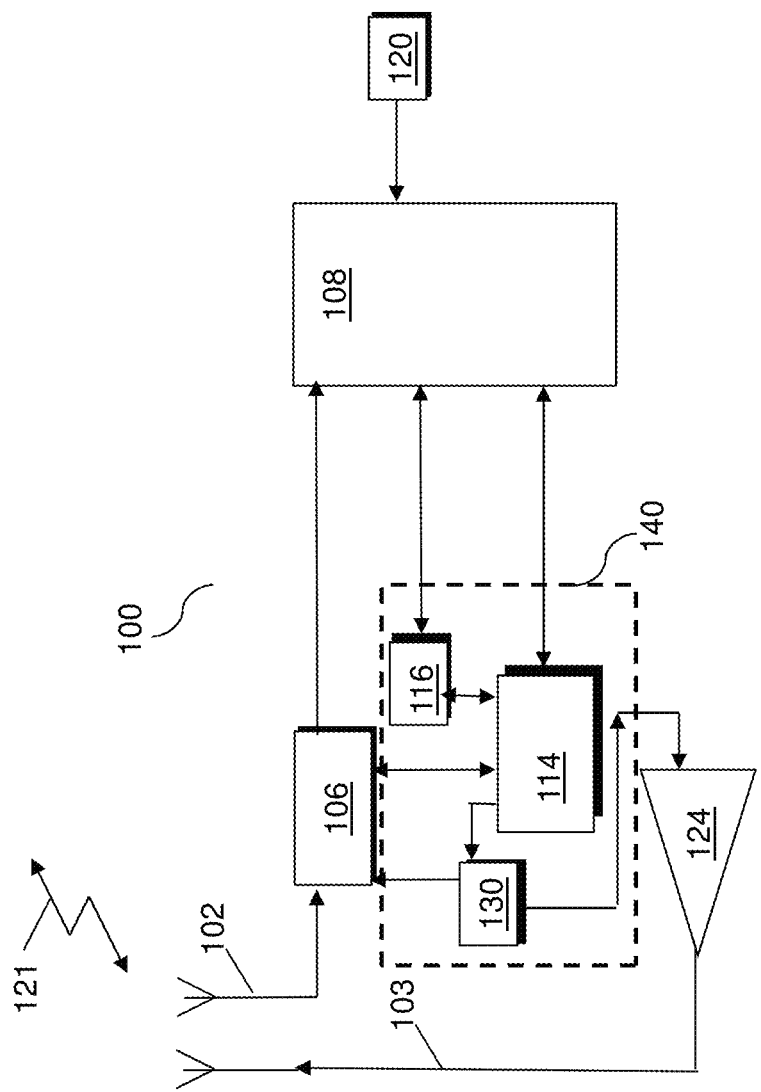
FIG. 1 illustrates an example block diagram of an electronic system with a clock signal, in a form of a radar unit, adapted according to example embodiments of the invention.

Examples of the invention can be applied to any electronic system that uses a clock. As one possible example implementation, and referring to FIG. 1, a block diagram of an electronic system, which in the illustrated example is in a form of a wireless communication unit is shown, adapted in accordance with some examples of the invention. Purely for explanatory purposes, the wireless communication unit is described in terms of a radar unit 100, for example operating at millimeter wave (MMW) frequencies that utilizes, say, a master-device-slave device arrangement. However, in other examples, it is envisaged that the concepts described herein may be employed in any electronic system that uses a clock signal, where a signal duty cycle needs to be tracked The radar unit 100 contains one or several antennas 102 for receiving radar signals 121, and one or several antennas 103 for transmitting radar signals, with one shown for each for simplicity reasons only. The number of antennas 102, 103 used may depend on the number of radar receiver and transmitter channels that are implemented in a given radar device. One or more receiver chains, as known in the art, include receiver front-end circuitry 106, effectively providing reception, frequency conversion, filtering and intermediate or base-band amplification, and finally an analog-to-digital conversion. In some examples, a number of such circuits or components may reside in signal processing module 108, dependent upon the specific selected architecture. The receiver front-end circuitry 106 is coupled to the signal processing module 108 (generally realized by a digital signal processor (DSP)). A skilled artisan will appreciate that the level of integration of receiver circuits or components may be, in some instances, implementation-dependent.

The microcontroller unit (MCU) 114 maintains overall operational control of the radar device 100, and in some examples may comprise time-based digital functions (not shown) to control the timing of operations (e.g. transmission or reception of time-dependent signals, FMCW modulation generation, etc.) within the radar unit 100. The MCU 114 is also coupled to the receiver front-end circuitry 106 and the signal processing module 108. In some examples, the MCU 114 is also coupled to a memory device 116 that selectively stores operating regimes, such as decoding/encoding functions, and the like.

As regards the transmitter 124, this essentially comprises a power amplifier (PA), and possibly a phase rotator, coupled to the transmitter's one or several antennas 103, antenna array, or plurality of antennas. In radar unit 100, radar transceiver topology is different from traditional wireless communication architectures (e.g. Bluetooth™, WiFi™, etc.), as modulation occurs within a phase locked loop (PLL) (typically via a fractional-N divider), and is applied directly to the transmitter 124. Therefore, in some examples, the receiver front-end circuitry 106 and transmitter 124 are coupled to frequency generation circuit 130 arranged to provide radio frequency (RF) local oscillator (LO) signals. The generated RF LO signals are thus modulated directly to generate transmit radar signals, and also used to down-convert received modulated radar signals to a final intermediate or baseband frequency or digital signal for processing in a receive operation.

Figure 4:
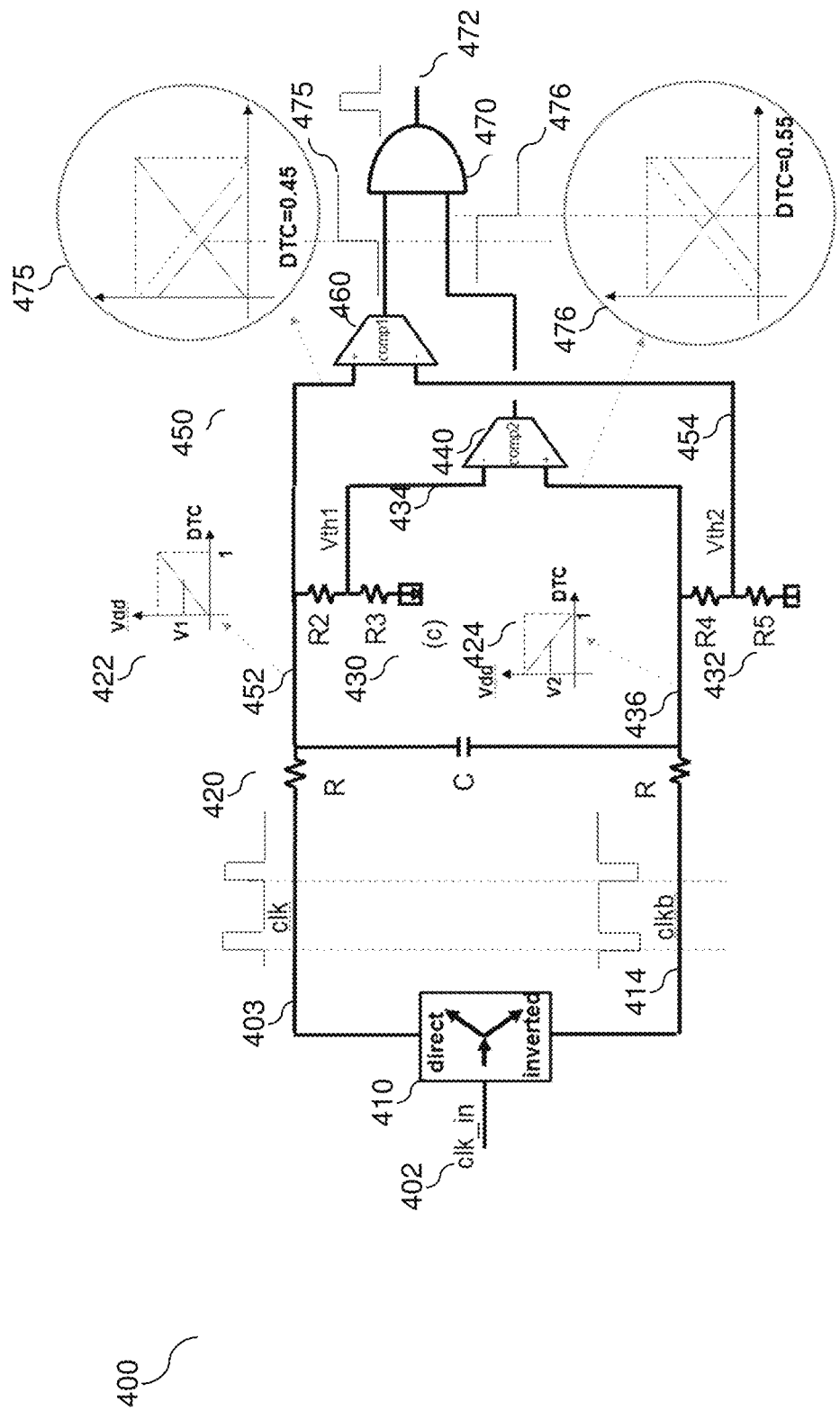
FIG. 4 illustrates an example of a duty cycle monitor circuit, according to example embodiments of the invention.

To address the aforementioned problems, examples of the invention describe a communication unit (such as a radar unit) that includes a robust duty cycle (DTC) monitoring circuit (FIG. 4) and method for duty cycle monitoring (FIG. 5) that takes advantage of differential detection and comparison in order to increase immunity against PVT variations, advantageously without any calibration or trimming operation. In this manner, the examples described herein are able to increase achievable accuracy of detected/monitored DTC. In examples of the invention, the DTC monitoring circuit uses a direct clock input path and an inverted clock input path, with a summation of the direct clock input path and an inverted clock input path effectively being a 'differential clock signal'. Variations in one path are compensated for by employing equivalent variations of a reference voltage from the other path. Subsequent comparison and summing of the signals in the direct clock signal paths and inverted clock signal paths are made, whereby any PVT variation occurs substantially equally on each path. In this manner, examples of the invention ensure a DTC with an accuracy of say <5% that can be detected (45% to 55%) under varying process, voltage or temperature (PVT). In some examples, this accuracy may be set by respective resistor ladders coupled to each path, as illustrated in FIG. 4. Examples of the invention describe a DTC monitoring circuitry comprising a differential signal generator circuit, an averaging circuit, a reference signal generation circuit (e.g. a cross-reference circuit, a comparison circuit and a summing circuit).

Clearly, the various components within the electronic system, which in the illustrated examples is in a form of radar unit 100, can be realized in discrete or integrated component form, with an ultimate structure therefore being an application-specific or design selection. A skilled artisan will appreciate that the level of integration of circuits or components may be, in some instances, implementation-dependent.

Figure 2:
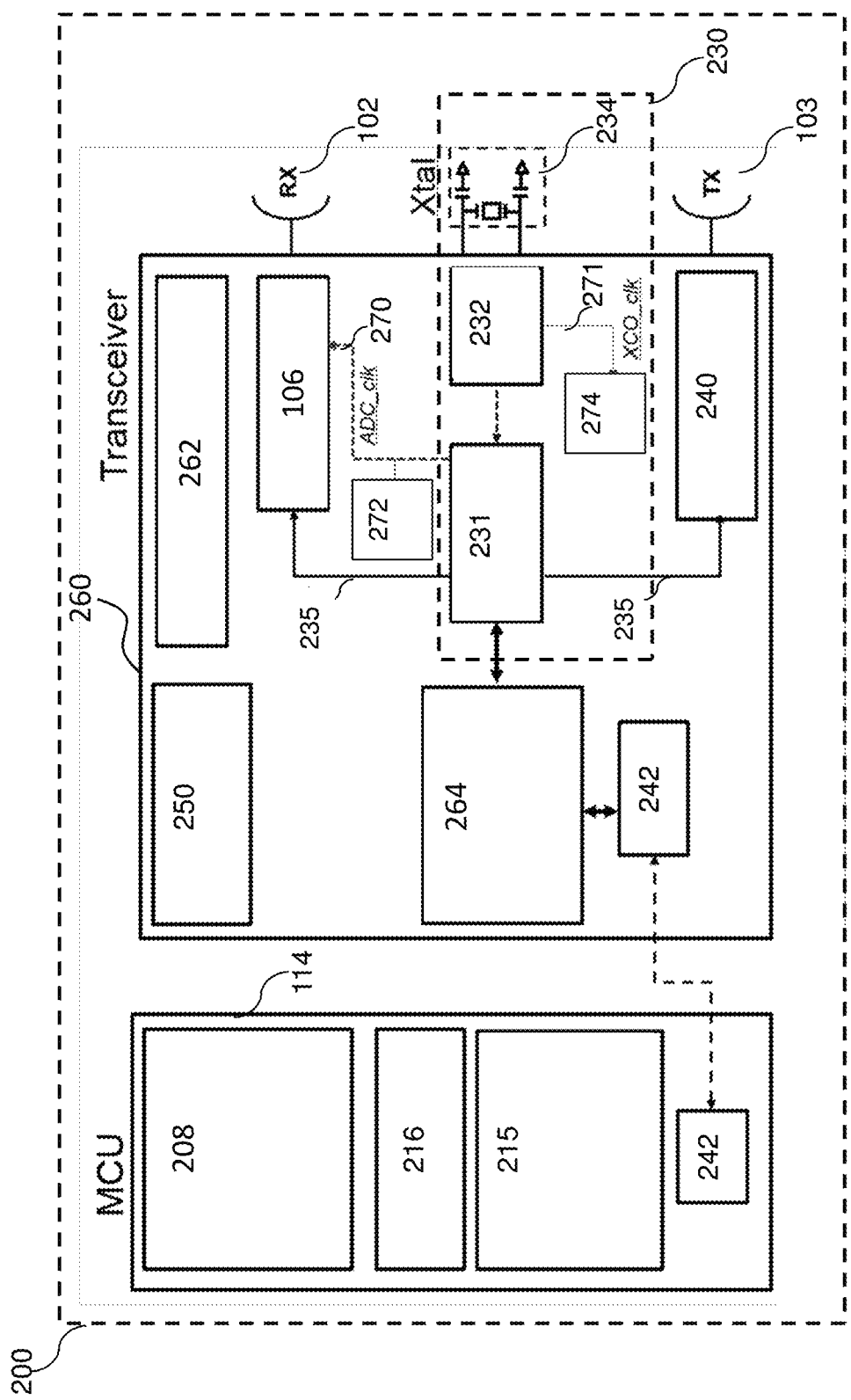
FIG. 2 illustrates a more detailed example block diagram of an electronic system with a clock signal, in a form of a radar unit with a microcontroller and transceiver circuits that include an example duty cycle monitoring circuit(s), adapted according to example embodiments of the invention.

Referring now to FIG. 2, an example block diagram of a radar device 200 with a radar transceiver 260, is illustrated in accordance with examples of the invention. The radar transceiver 260 includes safety sensor circuit(s) 262, a power management circuit 250, and one or more receivers 106, frequency generation circuit 230, one or more transmitters 240. The radar transceiver 260 also includes a digital part, which may be in a form of a digital IC, which includes a digital controller 264, which may include some functionality of the MCU 114. The radar device 200 includes an MCU 114 with a processing unit 208 coupled to a storage device 216, such as registers and/or memory and its own digital controller 215. Serial to parallel interface ports 242 connect the MCU 114 with the radar transceiver 260. The power management circuit 250 generates reference currents and voltages that are needed within radar device 200.

In this example, the frequency generation circuit 230 includes all the functionality related to a generation of the reference frequencies and radar frequencies to be transmitted and high frequency clock signals. The one or more transmitters 240 contain the functionality related to the emitted radar signal, whilst the one or more receivers 106 is/are dedicated to the reception and conversion of the reflected and received radar signal. The processing unit 208 is responsible for the digital signal processing of the data received from the radar transceiver 260, this data being, say, representative of a radar target speed, distance or speed variation. The storage unit 216 is the general memory of the MCU 114 that is responsible for both dynamic data storage (random access memory (RAM) and/or flash memory) as well as read only memory (ROM) (static) data storage. The digital controller 215 is in charge of the communication between all MCU different blocks and units, together with sequencing all the process (state machine) for the correct operation of the MCU 114 and controlling the interface of MCU 114 with other circuits (e.g. Radar Transceiver 260).

The frequency generation circuit 230 of the radar device 200 includes a resonator 234 coupled to the transceiver 260. The transceiver 260 includes a reference phase locked loop (PLL) 232 coupled to the resonator 234 and arranged to provide a reference clock signal to a main PLL 231. The main PLL 231 provides a radio frequency signal 235 to the transmitter(s) 240 to be modulated and transmit from transmit antenna 103, and radio frequency signal 235 to the receiver(s) 106, to enable radar signals received at receive antenna 102 to be down-converted.

In accordance with some examples of the invention, one or more duty cycle monitoring circuit(s) 272, 274 is/are included in frequency generation circuit 230, for example coupled to reference PLL 232 and configured to monitor an output crystal clock signal 271 and/or coupled to main PLL 231 and configured to monitor, say, an analog-to-digital converter (ADC) clock signal 270 input to the receiver(s) 106. In accordance with examples of the invention, the duty cycle monitoring circuit(s) 272, 274 is/are configured to use both a direct clock input and create and use an inverted representation of the clock input, as illustrated in FIG. 4. In accordance with examples of the invention, the duty cycle monitoring circuit(s) 272, 274 comprise(s) a differential signal generator circuit, an averaging circuit, a reference signal generation circuit (e.g. a cross-reference circuit), a comparison circuit and a summing circuit. In some examples, two DC averaged clock voltages are generated in a first path (e.g. a direct clock path) that are directly proportional to the signal DTC, whilst in the second path (e.g. the inverted clock path) the two DC averaged clock voltages are inversely proportional to the DTC in the first path. One of the two voltages of each path is used as the comparator input of the same path, whilst the second voltage is used as the comparator input of the other path. Thus, in this manner, the variations in one path are compensated by the variations of the associated reference voltage from the opposite path, obtained by the summing circuit (e.g. an 'AND' logic gate) in such a way that a very low PVT variation may be obtained.

Figure 3:
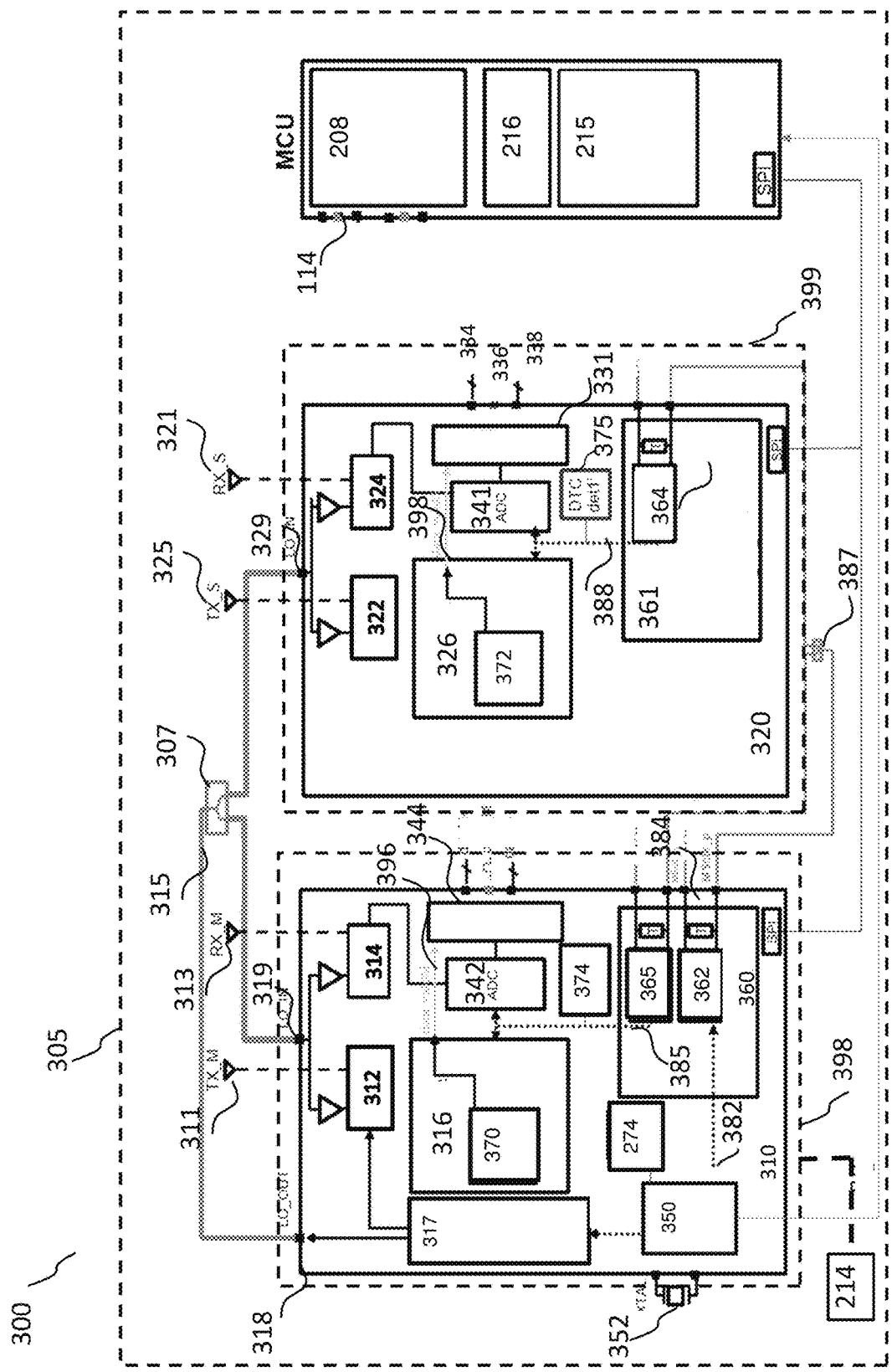
FIG. 3 illustrates an example diagram of a radar unit that cascades multiple chips in a Master-Slave distributed clock approach, which includes an example duty cycle monitoring circuit(s) according to example embodiments of the invention.

Referring now to FIG. 3, an example block diagram of a communication unit 300 having a master-slave architecture is illustrated. In this example, the master-slave architecture is illustrated as a radar unit 305 that includes a master device 310 and one or multiple slave devices 320. One slave device 320 is shown for clarity purposes only. In this example, the master device 310 incorporates a radar transceiver formed by at least a frequency generation circuit, which in this example includes a reference phase locked loop (PLL) 350 and a main PLL 317. An output from the main PLL 317 provides a local oscillator (LO) signal to a local oscillator output pin 318, which is routed via a LO_out path 315 to a radio frequency (RF) splitter 307 that is coupled to each master and slave LO input pin (LO_in) 319, 329 via, say, an equal transmission line length (e.g. via a star configuration). In some examples, by using equal transmission line lengths, it is possible to ensure equal delay and phase aligned signals for the LO, applied across all master device(s) 310 and slave devices 320 for the generation and reception of radar signals.

The master device 310 further includes a digital controller 316 and a transmitter circuit 312 comprising one to several transmitter channels (TX_CH) and a receiver circuit 314 comprising one to several receiver channels (RX_CH). In a transmitter mode of operation in the master device 310, the digital controller 316 may provide a transmit radar signal to the main PLL 317 to generate a modulated transmit signal. The modulated transmit signal is then optionally passed to a buffer or frequency multiplier in the transmitter circuits 312, 322 (if the generated signal is not at the operating frequency of the radar unit 305) of the respective master device(s) 310 and slave device(s) 322. A high-frequency output of the transmitter circuit 312 is passed to a power amplifier, say, via a phase shifter circuit (both not shown for simplicity purposes only), where it is amplified and routed to the one or more transmitter antenna(e) 311 (and in some examples routed to the one or more transmitter antenna(e) 325 in the one or more slave device(s) 320.

In a receiver mode of operation in the master device 310 and slave device 320, a received radar signal may be received at the one or more receiver antenna(s) 313, 321 and passed to master and slave receiver circuits 314, 324 that include a low noise amplifier (LNA) configured to amplify the received radar signal. The amplified received radar signal is passed to a down-mixer (not shown for simplicity purposes only), where it is mixed with the received high-frequency LO signal 315 received from the master device 310.

The master device 310 further includes one or more programmable bandpass filter(s) and one or more gain amplifiers (not shown), as well as one or several ADC(s) 342 that is/are coupled to the one to several receiver channels (RX_CH) 314, as well as a serial interface 344. The one or several ADC(s) 342 process a relative narrow band signal, for example in a range between a few kHz up to tenths of MHz.

In accordance with examples of the invention, the master device 310 further includes a master-slave clock distribution and synchronization circuit 360 that includes a modulator 362, a first demodulator 365 in the master device 310, and a second demodulator 364 in the slave device 320. In this example, the reference clocks are generated on the master device 310 using the reference PLL 350, tied to an external crystal resonator 352, and sent as a first clock signal (clk1) to the main PLL 317 and a master-slave clock signal (clk2) 382 to master-slave clock distribution and synchronization circuit 360. In this example, the modulator 362 (and demodulator 364) may be terminated by a 100 ohms differential resistor (T) 384, as well as all other slave clock demodulators, in order to reduce any reflections due to link asymmetry, which may corrupt the signal integrity and cause false zero crossings.

In this example, each radar slave device 320 includes a digital controller 326 and a transmitter circuit 322 comprising one to several transmitter channels (TX_CH) and a receiver circuit 324 comprising one to several receiver channels (RX_CH). The slave device 320 further includes one or several ADC(s) 341 that is/are coupled to the one to several receiver channels (RX_CH) 324 as well as a serial interface 334. In accordance with examples of the invention, the slave device 320 further includes a slave-based master-slave clock distribution and synchronization circuit 361, where only a receiver demodulator 364 is enabled.

In some examples, as appreciated by a skilled person, the slave device 320 may be configurable as a master device 310, but with a number of circuits or components or functionality disabled. For example, in such a slave device 320, since the clock and sync signal as well as LO signals are received from the master device 310, a slave reference PLL, main PLL and the MS_CLK transmit circuits are disabled. Many other circuits or components may be present inside the slave device 320, but are not mentioned herein to avoid obfuscating concepts of the invention.

A skilled artisan will appreciate that many other circuits, components and blocks may be present inside a master device 310 and slave device 320, but that these have also been omitted purely for clarity purposes. In this manner, a system, such as a phased array FMCW imaging radar system, employing example embodiments of the invention relating to a master-slave arrangement, may be able to benefit from improved clock duty cycle monitoring accuracy.

In some examples, the master device 310 is configured to generate and distribute a master-slave clock 384 from a MS_clock transmit modulator 326 path to the MS_clock receive path inside slave device(s) 320, and back to master device RX demodulator 365, in, say, a star configuration. In this manner, in some examples, an ADC clock applied to both master device(s) and slave device(s) may be perfectly aligned, so long as the transmission line length to each of the receivers is matched. Furthermore, in some examples, the clock signal with an embedded start of a frame indication may be used to sample the data inside different ADCs belonging to different ICs, in order to reduce phase error and consequently angle resolution at sensor level.

Figure 5:
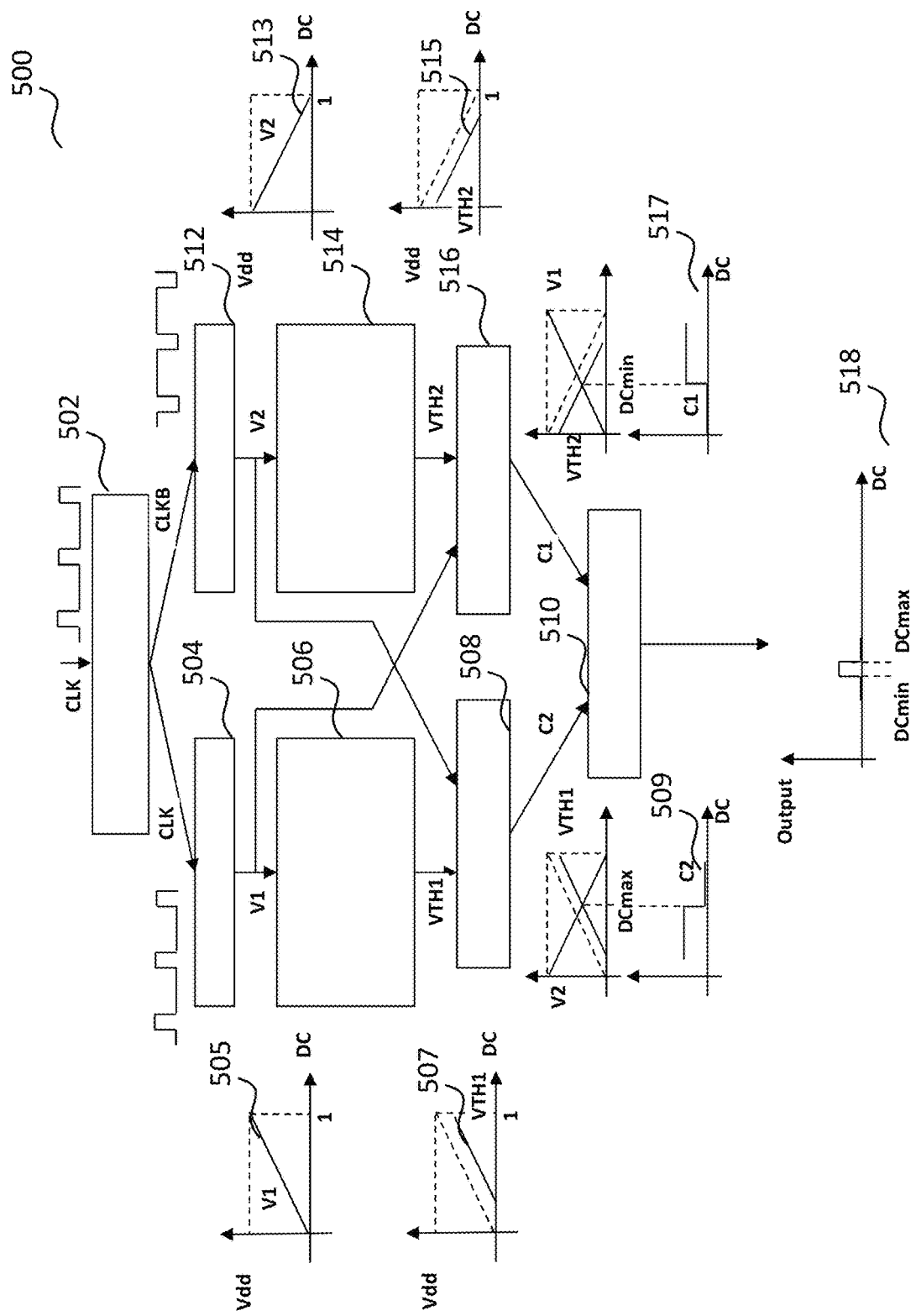
FIG. 5 illustrates an example flowchart of the operations associated with duty cycle monitoring across multiple master device(s)-slave device(s), according to example embodiments of the invention.

In accordance with examples of the invention, for the master-slave architecture of the communication unit 300, a duty cycle monitoring circuit 274 is included within master device 310 and connected to reference PLL 350, which is tied to external crystal resonator 352, and configured to send the first clock signal (clk1) to the main PLL 317. In addition, the reference PLL 350 sends the master-slave clock signal (clk2) 382 to master-slave clock distribution and synchronization circuit 360. In this example, one or both of the first clock signal (clk1) and the master-slave clock signal (clk2) 382 is/are input to the duty cycle monitoring circuit 274 to monitor the duty cycle of the respective clock signal. Duty cycle monitoring circuit 274 uses a direct clock input of one or both of the first clock signal (clk1) and the master-slave clock signal (clk2) 382, and creates and uses an inverted representation of the respective clock input to monitor the respective duty cycle of the respective clock input, for example in the manner as illustrated in FIG. 4 and FIG. 5.

In accordance with examples of the invention, for the master-slave architecture of the communication unit 300, a further duty cycle monitoring circuit 374 is included within master device 310 and connected to a re-created system master clock signal 385, generated by receive modulator 365. In this example, the re-created system master clock signal 385 is input to the duty cycle monitoring circuit 374 to monitor the duty cycle of re-created system master clock signal 385. Similarly, duty cycle monitoring circuit 374 uses a direct clock input of re-created system master clock signal 385, and creates and uses an inverted representation of the re-created system master clock signal 385 to monitor the duty cycle, for example in the manner as illustrated in FIG. 4 and FIG. 5.

In a similar manner, in accordance with examples of the invention, for the master-slave architecture of the communication unit 300, a further duty cycle monitoring circuit 375 is included within slave device 320 and connected to a re-created system slave clock signal 388, generated by slave receive modulator 364. In this example, the re-created system slave clock signal 388 is input to the duty cycle monitoring circuit 375 to monitor the duty cycle of re-created system slave clock signal 388. Similarly, duty cycle monitoring circuit 375 uses a direct clock input of re-created system slave clock signal 388, and creates and uses an inverted representation of the re-created system slave clock signal 388 to monitor the duty cycle, for example in the manner as illustrated in FIG. 4 and FIG. 5.

In accordance with examples of the invention, the duty cycle monitoring circuits 274, 374, 375 comprise a differential signal generator circuit, an averaging circuit (such as a filtering circuit), a reference signal generation circuit (e.g. a cross-reference circuit), a comparison circuit and a summing circuit, as illustrated in FIG. 4. In some examples, DC voltages are generated in a first path (e.g. the direct clock path) that are directly proportional to the signal DTC in the other path (e.g. the inverted clock path), whilst in the second path (e.g. the inverted clock path), the DC voltage is inversely proportional to the DTC in the first path. Thus, in this manner, the variations in one path are compensated by the variations of the reference voltage from the opposite path, obtained by the summing circuit (e.g. an 'AND' logic gate) in such a way that a very low PVT variation may be obtained.

Also for example, in one embodiment, the illustrated examples of a master device 310 or slave device 320 may be implemented as circuitry located on a single integrated circuit 398, 399. Alternatively, the circuit and/or component examples may be implemented as any number of separate integrated circuits 398, 399 interconnected with each other in a suitable manner. The specifications and drawings are, accordingly, to be regarded in an illustrative rather than in a restrictive sense.

Referring now to FIG. 4, an example duty cycle monitor circuit 400 is illustrated, according to example embodiments of the invention. A clock signal 402, such as a single-ended clock signal, is input to an into a differential signal generator 410, which provides the clock signal into a direct clock signal (CLK) path 403 (which is not exactly the same signal as the input clock signal 402, but may have the same phase with a different delay to the input clock signal 402) and an inverted clock signal into an inverted clock signal (CLK_B) path 414. In other examples of the invention, the differential signal generator 410 may be replaced by any circuit or component that includes one input and two outputs, in a form of an inverted output and non-inverted output. In some examples, the clock signal 402 input to the differential signal generator 410 is a CMOS level signal, and the output clock signal is a differential clock signal. The differential signal generator circuit 410 may be implemented by using various known circuits, such as an inverter, a single-ended to differential converter or an inverter chain. In some examples, an inverter chain based implementation is preferable because of an inherent low variation of DTC against PVT, as compared to single-ended to differential converter. In some examples, the inverter chain is composed of inverters or buffers that are correctly sized in order to avoid different edges delay and further DTC variations.

The non-inverted clock signal (CLK) in the direct clock signal path 403 (i.e. a non-inverted representation of the input clock signal 402) and the inverted clock signal (CLK_B) in the inverted path 414 are both input to an averaging circuit 420, which is composed of a resistor-capacitor (RC) filter circuit, configured to average the duty cycle component of the clock signals to a given voltage level, as illustrated in this examples. The averaging circuit 420 also creates a first DC voltage that varies directly proportional to the DTC (direct path, or clock) 422 and a second DC voltage that varies inversely proportional to the DTC (inverted path, or clock_b) 424, with the maximum DTC=1 being reached at supply voltage value (Vdd) for direct path, while the maximum voltage is achieved at DTC=0 for the inverter path.

These two filtered voltages V1 452 and V2 436 are then input to a respective reference generator circuit 430, 432 and a comparator circuit 450. The respective reference generator circuits 430, 432 generate a voltage reference at a given DTC, on both the direct path and the inverted path via a respective resistor ladder (e.g. R2, R3 to generate Vth1 434; and R4, R5 to generate Vth2 454). Variations around the filtered signal may also be present on these voltage reference thresholds 434 454.

The reference voltage Vth1 434 of the direct path (Vth1=V1*R3/(R2+R3)) is used as reference for first comparator 440 on the inverted path signal 436. Similarly, the reference voltage Vth2 454 of the inverted path (Vth2=V2*R5/(R4+R5)) is used as reference for a second comparator 460 located on the direct path signal 452. By doing this, variations of one single ended path are compensated in the other path, thereby allowing very accurate and robust DTC detection ranges to be achieved. In this example, the resistor ladder may be used to set the duty cycle threshold.

In this manner, by use of a cross reference comparator design V1 452/Vth2 454 on second comparator 460 and V2 436/Vth1 434 on first comparator 440), the outputs of first comparator 440 and second comparator 460 of the comparator circuit are independent from any PVT variations.

In some examples of the invention, the comparator circuit 450 may use very low offset comparators in order to not degrade the accuracy of the full DTC system monitoring and circuitry. In this manner, as illustrated, the outputs of first comparator 440 and second comparator 460 are slightly offset.

In examples of the invention, the outputs of first comparator 440 and second comparator 460 of the comparator circuit 450 are input to a summing circuit, which in this example consists of an 'AND' logic gate that is used to output a pulse 472 that is representative of the DTC threshold (lower, higher) that the system can detect and/or monitor. In this manner, the first comparator 440 detects when the duty cycle is too low (e.g. below 0.45 in the example of FIG. 4) based on the output signal 475 from the second comparator 460, whereas the second comparator 460 detects when the duty cycle is too high (e.g. higher than 0.55 in the example of FIG. 4) based on the output signal 476 from the first comparator 440. The logic 'AND' gate 470, in this example, outputs only one signal 472 at a level high or '1' for 0.45<DTC<0.55 that is dependent from both output signal 475 and output signal 476. In this manner, the comparators 440, 460 remove PVT variations, as their inputs V1/Vth2 and V2/Vth1 vary in the same way in PVT.

In this manner, the use of both sides of a duty cycle window, using a direct clock path and an inverted clock path, allows the voltages V1 and V2 to vary at the same rate but move with opposite slopes vs. the duty cycle. As the reference voltages Vth1 434 and Vth2 454 are proportional to V1 452 and V2 436 through the resistive ladders R2/R3 430 and R4/R5 432, thereby sending V1 452 and Vth2 454 in a comparator, and the same for V2 436 and Vth1 434, will trigger the comparison based on the values of the four resistors. A benefit of the duty cycle monitor circuit 400 in producing the two voltages that are compared (for example V1 452 and Vth2 454 coming from the normal and inverted path) is that they will move the same way depending on the process, voltage, and temperature (PVT) variations, and hence the comparison is advantageously independent of any PVT variations in the circuit or communications device.

Referring now to FIG. 5 an example flowchart 500 of the operations associated with duty cycle monitoring, say, in an electronic system, which in the illustrated example is in a form of a radar unit that applies a clock signal across multiple master device(s)-slave device(s), is illustrated, according to example embodiments of the invention.

The example flowchart 500 encompasses a method for monitoring a duty cycle of a clock signal, at a duty cycle monitoring circuit (DTC) that includes receiving a generated clock signal; and generating an inverted representation and a non-inverted representation of the generated clock signal. The example flowchart 500 also includes averaging the inverted representation of the generated clock signal; and averaging the non-inverted representation of the generated clock signal. The example flowchart 500 also includes generating a second respective reference voltage threshold (Vth2) associated with the averaged inverted representation of the generated clock signal and comparing the averaged non-inverted representation of the clock signal with the second respective reference voltage threshold (Vth2) in a first comparator and generating a first respective reference voltage threshold (Vth1) associated with the filtered non-inverted representation of the generated clock signal, and comparing the first respective reference voltage threshold (Vth1) with the averaged inverted representation of the clock signal in a second comparator. The example flowchart 500 also includes summing outputs of the first and second comparators to generate a monitored duty cycle of the generated clock signal.

In examples of the invention, at 502, a master device starts by transforming a single-ended clock into a differential clock signal and provides the differential clock signal into a direct clock signal path (CLK) and an inverted clock signal path (CLK_B). In some examples, at 504, an average of the differential clock signal in the direct clock signal path (CLK) is calculated, to produce a first varying voltage (V1) 505. Similarly, at 512, an average of the differential inverted clock signal in the inverted clock signal path (CLK_B) is calculated, to produce a second varying voltage (V2) 513.

At 506, a first reference signal is created from the first varying voltage (V1) 505 that represents one side of the duty cycle window, to produce a third varying voltage (VTH1) 507, which varies at the same rate as the first varying voltage (V1) 505. At 508, the third varying voltage (VTH1) 507 is compared with the second varying voltage (V2) 513, to produce a second voltage change (C2) of an output signal, where the second voltage change (C2) 509 represents a DC maximum value. Similarly, at 514, a second reference signal is created from the second varying voltage (V2) 513 that represents the other side of the duty cycle window, to produce a fourth varying voltage (VTH2) 515, which varies at the same rate as the second varying voltage (V2) 513. At 516, the fourth varying voltage (VTH2) 515 is compared with the first varying voltage (V1) 505, to produce a first voltage change (C1) 517 of an output signal, where the first voltage change (C1) represents a DC minimum value.

In this manner, the use of a direct clock path and an inverted clock path allows the voltages V1 505 and V2 513 to move with opposite slopes vs. the duty cycle. As the reference voltages Vth1 507 and Vth2 515 are proportional to V1 505 and V2 513 and respective voltage changes are slightly offset with the DC (duty cycle). A benefit of producing the two voltages that are compared (for example V1 505 and Vth2 515 coming from the normal and inverted path) is that they will move the same way depending on the process, voltage, and temperature (PVT) variations, and hence the comparison is advantageously independent of any PVT variations in the circuit or communications device. At 510, the first voltage change (C1) and the second voltage change (C2) 509 are logically 'AND' ed, to produce an output pulse 518 that transitions between and identifies the DC minimum value to the DC maximum value. The flowchart then ends.

Thus, examples of the invention describe a communication unit (such as a radar unit) that includes a robust duty cycle monitoring circuit and method for duty cycle monitoring that uses direct clock input and inverted clock inputs. Some examples of the invention utilise cross reference comparator circuits and a differential comparison to remove any single-ended signal variations that are compensated, in this implementation, without any calibration or trimming. Examples of the invention describe a DTC monitoring circuitry comprising a differential signal generator circuit, a filtering circuit, a reference signal generation circuit (e.g. a cross-reference circuit, a comparison circuit and a summing circuit. In some examples, the DTC of an input signal is made differential, filtered and transformed into a DC voltage on each single-ended path, whereby the DC voltages generated in one path are directly proportional to the signal DTC in a non-inverted path, whilst in the second (inverted input) path, the DC voltage is inversely proportional to the DTC in this path. The variations in one path are compensated by the variations of the reference voltage from the opposite path, obtained by the summing unit (e.g. 'AND' gate) in such a way that a very low PVT variation may be obtained ensuring a DTC with an accuracy lower than <5% can be detected (45% to 55%) under VT and mismatch conditions. In some examples, this accuracy may be set by respective resistor ladders 430, 432.

Although examples of the invention are described with reference to a radar unit suitable for an automotive application, it is envisaged that the concepts herein described may be applicable to other applications, such as radar for robotics or drones.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. The connections as discussed herein may be any type of connection suitable to transfer signals from or to the respective nodes, units or integrated circuit devices. Accordingly, unless implied or stated otherwise, the connections may for example be direct connections or indirect connections. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electronic system comprising:
   a clock generation circuit configured to generate a clock signal; and
   a duty cycle monitoring circuit, DTC, operably coupled to the clock generation circuit and configured to monitor a duty cycle of the generated clock signal;
   wherein the communication unit is characterized in that:
   the DTC comprises:
      a differential signal generator configured to receive the generated clock signal and generate an inverted representation of the generated clock signal and generate a non-inverted representation of the generated clock signal;
      an averaging circuit operably coupled to the differential signal generator and configured to average the generated non-inverted clock signal and average the inverted representation of the generated clock signal;
      a comparison circuit comprising at least a first comparator configured to receive and compare the averaged non-inverted generated clock signal with a second respective reference voltage threshold and a second comparator configured to receive and compare the averaged inverted representation with a first respective reference voltage threshold;
      a reference voltage generation circuit operably coupled to the averaging circuit and configured to provide the first respective reference voltage threshold associated with the averaged inverted representation of the generated clock signal and provide the second respective reference voltage threshold associated with the averaged non-inverted representation of the generated clock signal; and
      a summing circuit operably coupled to the comparison circuit and configured to sum outputs of the first comparator and second comparator wherein an output of the summing circuit comprises a monitored duty cycle of the generated clock signal.

2. The electronic system of claim 1 wherein the generated clock signal is a single ended clock signal and the comparison circuit and reference voltage generation circuit is formed by cross connected reference voltages with the comparison circuit configured to perform a differential comparison of an averaged generated clock signal with a respective reference voltage threshold.

3. The electronic system of claim 2 wherein the comparison circuit being configured to perform a differential comparison of an averaged generated clock signal with a respective reference voltage threshold that removes single ended DTC variations of the generated clock signal over one or more of process, voltage, temperature, PVT, variations.

4. The electronic system of claim 1 wherein the reference voltage generation circuit comprises at least two sets of resistor ladders configured to provide a fixed reference voltage threshold to respective comparator inputs.

5. The electronic system of claim 1 wherein the differential signal generator circuit is configured to transform a received single-ended generated clock signal into a differential DTC signal on a non-inverted clock signal path and an inverted clock signal path of the DTC.

6. The electronic system of claim 4 wherein a first fixed reference voltage threshold generated on a clock signal path is directly proportional to a DTC signal in a non-inverted clock signal path, and a second fixed reference voltage threshold generated on an inverted clock signal path is directly proportional to a signal DTC in the inverted clock signal path and inversely proportional to the DTC signal in the non-inverted clock signal path.

7. The electronic system of claim 1 wherein the averaging circuit averages the generated clock signal and averages the inverted representation of the generated clock signal by converting the clock pulses into a varying DC voltage.

8. The electronic system of claim 1 wherein the averaging circuit is a resistor-capacitor filter.

9. The electronic system of claim 1 wherein the electronic system comprises at least one master device and at least one slave device, where the master device generates a master system clock signal to distribute to other devices including the at least one slave device, where the at least one master device comprises a reference phase locked loop, PLL, circuit arranged to generate the clock signal.

10. The electronic system of claim 9 wherein each of the at least one master device and at least one slave device comprises a receive clock signal demodulator configured to receive the distributed master system clock signal and re-create a system clock signal, and each of the at least one master device and at least one slave device is coupled to the DTC that is configured to monitor a respective re-created system clock signal.

11. The electronic system of claim 1 wherein the electronic system is a communication unit.

12. A duty cycle monitoring circuit, DTC, configured to receive and monitor a duty cycle of a generated clock signal;
wherein the DTC is characterized by:
   a differential signal generator configured to receive the generated clock signal and generate an inverted representation of the generated clock signal, and generate a non-inverted representation of the generated clock signal;

an averaging circuit operably coupled to the differential signal generator and configured to average the generated non-inverted clock signal and average the inverted representation of the generated clock signal;

a comparison circuit comprising at least a first comparator configured to receive and compare the averaged non-inverted generated clock signal with a second respective reference voltage threshold and a second comparator configured to receive and compare the averaged inverted representation with a first respective reference voltage threshold;

a reference voltage generation circuit operably coupled to the averaging circuit and configured to provide the first respective reference voltage threshold associated with the averaged inverted representation of the generated clock signal and provide the second respective reference voltage threshold associated with the averaged non-inverted representation of the generated clock signal; and a summing circuit operably coupled to the comparison circuit and configured to sum outputs of the first comparator and second comparator wherein an output of the summing circuit comprises a monitored duty cycle of the generated clock signal.

13. A method for monitoring a duty cycle of a clock signal, wherein the method comprises, at a duty cycle monitoring circuit, DTC:

receiving a generated clock signal;

generating, in a differential signal generator circuit, an inverted representation and a non-inverted representation of the generated clock signal;

averaging, in an averaging circuit, the inverted representation of the generated clock signal;

averaging, in an averaging circuit, the non-inverted representation of the generated clock signal;

generating a second respective reference voltage threshold associated with the averaged inverted representation of the generated clock signal and comparing, in a comparison circuit, the averaged non-inverted representation of the clock signal with the second respective reference voltage threshold in a first comparator;

generating, in a reference voltage generation circuit, a first respective reference voltage threshold associated with the filtered non-inverted representation of the generated clock signal, and comparing the first respective reference voltage threshold with the averaged inverted representation of the clock signal in a second comparator; and summing outputs of the first and second comparators to generate a monitored duty cycle of the generated clock signal.

14. The method of claim 13 wherein the generated clock signal is a single ended clock signal and the comparison circuit and reference voltage generation circuit is formed by cross connected reference voltages with the comparison circuit configured to perform a differential comparison of an averaged generated clock signal with a respective reference voltage threshold.

15. The method of claim 14 wherein the comparison circuit performs a differential comparison of an averaged generated clock signal with a respective reference voltage threshold that removes single ended DTC variations of the generated clock signal over one or more of process, voltage, temperature, PVT, variations.

16. The method of claim 13 wherein the reference voltage generation circuit comprises at least two sets of resistor ladders configured to provide a fixed reference voltage threshold to respective comparator inputs.

17. The method of claim 13 wherein the differential signal generator circuit transforms a received single-ended generated clock signal into a differential DTC signal on a non-inverted clock signal path and an inverted clock signal path of the DTC.

18. The method of claim 17 wherein a first fixed reference voltage threshold generated on a clock signal path is directly proportional to a DTC signal in a non-inverted clock signal path, and a second fixed reference voltage threshold generated on an inverted clock signal path is directly proportional to a signal DTC in the inverted clock signal path and inversely proportional to the DTC signal in the non-inverted clock signal path.

19. The method of claim 13 further comprising averaging the generated clock signal and averaging the inverted representation of the generated clock signal by converting the clock pulses into a varying DC voltage.

20. The method of claim 13 wherein the averaging circuit is a resistor-capacitor filter.

* * * * *